(12) United States Patent
Vimercati

(10) Patent No.: US 11,763,871 B2
(45) Date of Patent: Sep. 19, 2023

(54) SYSTEMS AND METHODS FOR 1.5 BITS PER CELL CHARGE DISTRIBUTION

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/582,941

(22) Filed: Jan. 24, 2022

(65) Prior Publication Data

US 2022/0172764 A1 Jun. 2, 2022

Related U.S. Application Data

(63) Continuation of application No. 17/108,268, filed on Dec. 1, 2020, now Pat. No. 11,244,715.

(51) Int. Cl.
*G11C 11/22* (2006.01)

(52) U.S. Cl.
CPC ...... *G11C 11/2275* (2013.01); *G11C 11/2259* (2013.01); *G11C 11/2273* (2013.01); *G11C 11/2293* (2013.01); *G11C 11/2297* (2013.01)

(58) Field of Classification Search
CPC ............ G11C 11/2275; G11C 11/2259; G11C 11/2273; G11C 11/2293
See application file for complete search history.

(56) References Cited

U.S. PATENT DOCUMENTS

| | | | |
|---|---|---|---|
| 6,639,823 B2 | 10/2003 | Hasegawa | |
| 9,899,073 B2 | 2/2018 | Kawamura | |
| 10,153,021 B1 | 12/2018 | Di Vincenzo | |
| 10,153,022 B1 | 12/2018 | Di Vincenzo | |
| 10,534,840 B1 * | 1/2020 | Petti | G11C 7/12 |

(Continued)

FOREIGN PATENT DOCUMENTS

TW I671758 B 9/2019

OTHER PUBLICATIONS

International Search Report and Written Opinion for PCT Application No. PCT/US2021/056481 dated Feb. 10, 2022 (10 pages).

(Continued)

*Primary Examiner* — Han Yang
(74) *Attorney, Agent, or Firm* — Fletcher Yoder, P.C.

(57) ABSTRACT

Memory cells are described that include two reference voltages that may store and sense three distinct memory states by compensating for undesired intrinsic charges affecting a memory cell. Although embodiments described herein refer to three memory states, it should be appreciated that in other embodiments, the memory cell may store or sense more than three charge distributions using the described methods and techniques. In a first memory state, a programming voltage or a sensed voltage may be higher than a first reference voltage and a second reference voltage. In a second memory state, the applied voltage or the sensed voltage may be between the first and the second reference voltages. In a third memory state, the applied voltage or the sensed voltage may be lower than the first and the second reference voltages. As such, the memory cell may store and retrieve three memory states.

20 Claims, 8 Drawing Sheets

(56) References Cited

U.S. PATENT DOCUMENTS

| | | |
|---|---|---|
| 2004/0233729 A1 | 11/2004 | Iwase et al. |
| 2005/0052896 A1* | 3/2005 | Kang .................. G11C 11/5657 |
| | | 365/145 |
| 2006/0118841 A1* | 6/2006 | Eliason .................. H10B 53/00 |
| | | 257/295 |
| 2008/0084751 A1 | 4/2008 | Li et al. |
| 2008/0144368 A1 | 6/2008 | Kamei |
| 2009/0059648 A1 | 3/2009 | Shuto |
| 2010/0142268 A1 | 6/2010 | Aritome |
| 2011/0182102 A1 | 7/2011 | Minami et al. |
| 2018/0294025 A1 | 10/2018 | Bedeschi et al. |
| 2019/0287599 A1 | 9/2019 | Higashi et al. |

OTHER PUBLICATIONS

Taiwan Office Action for TW Application No. 110141760 dated Jul. 7, 2022 (9 pages).

* cited by examiner

SYSTEMS AND METHODS FOR 1.5 BITS PER CELL CHARGE DISTRIBUTION

CROSS-REFERENCE TO RELATED APPLICATION

This application is a continuation of U.S. Non-Provisional application Ser. No. 17/108,268, entitled "SYSTEMS AND METHODS FOR 1.5 BITS PER CELL CHARGE DISTRIBUTION," filed Dec. 1, 2020, which is herein incorporated by reference in its entirety for all purposes.

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following relates generally to memory devices and more specifically to multi-level accessing, sensing, and other operations for memory cells using multiple charges. The techniques and methods described herein may be used with ferroelectric memory devices or other type of memory devices. Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous. Some of the memory devices include memory cells that may be accessed by turning on a transistor that couples the memory cell (e.g., the capacitor) with a wordline or a bitline.

FeRAM may use similar device architectures as a volatile memory but may have non-volatile properties due to the use of a ferroelectric capacitor as a storage device. FeRAM devices may thus have improved performance compared to some other non-volatile and volatile memory devices. Some FeRAM relies on splitting sense windows of one storage mechanism to store memory bits, but doing so may provide for storing only 2 states per memory cell.

BRIEF DESCRIPTION OF THE DRAWINGS

Various aspects of this disclosure may be better understood upon reading the following detailed description and upon reference to the drawings in which.

DETAILED DESCRIPTION

Figure 1:
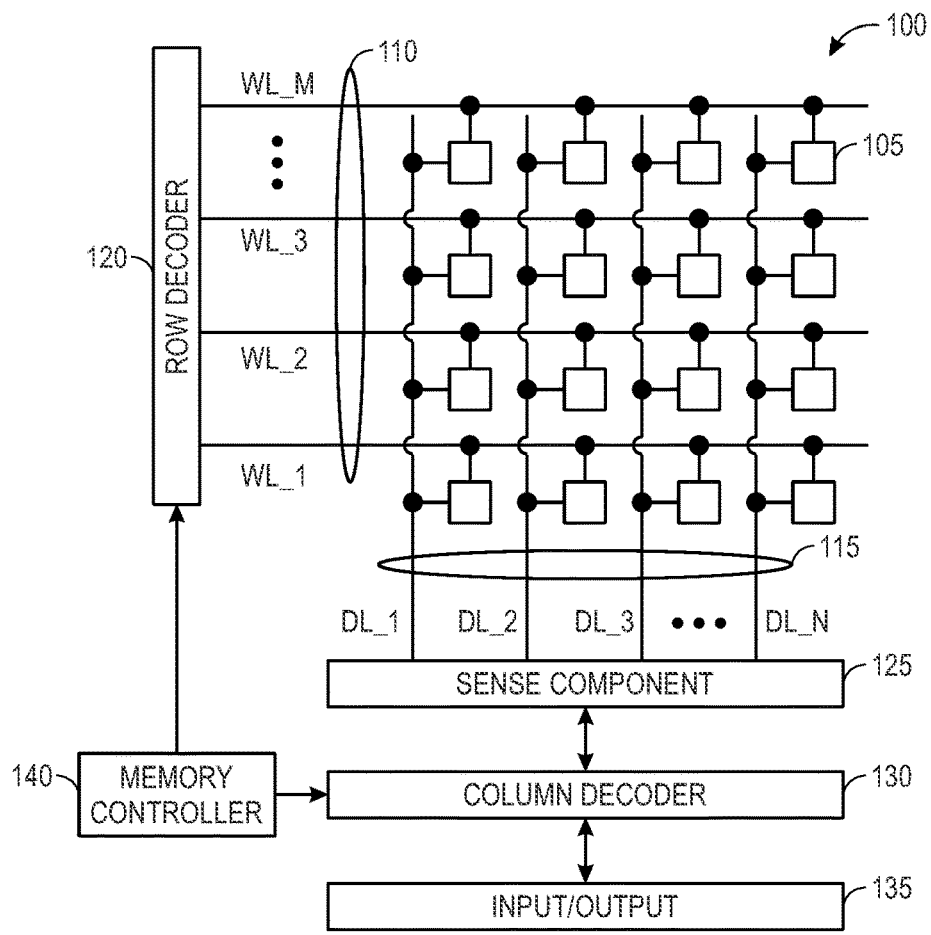
FIG. 1 is an example of a memory array that supports multi-level accessing, sensing, and other operations for ferroelectric memory, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Different memories may use different memory architectures to store and retrieve data bits using different memory states. In some embodiments, each memory state may refer to a distinct distribution of charges on a memory cell. For example, each memory cell of a ferroelectric random access memory (FeRAM) may include a ferroelectric capacitor including ferroelectric material. The ferroelectric capacitor may store memory states using charge dipoles of the memory cell (e.g., positive and negative charge distributions). A state of such memory cells may be written to or read from by applying a voltage. In specific embodiments, the applied voltage may flip the memory cell dipole. Such memory cells may use a reference voltage, as a threshold, to distinctively identify whether a positive or negative charge distribution (e.g., dipole) is being written or sensed. In some embodiments, an intermediary memory state (e.g., third memory state) may be programmed and sensed using an intermediary charge distribution between the positive and negative charge distributions.

In the embodiments described herein, memory cells are described that include two reference voltages that may store and sense three distinct memory states by compensating for undesired intrinsic charges affecting the memory cell. Although embodiments described herein refer to three memory states, it should be appreciated that in other embodiments, the memory cell may store or sense more than three charge distributions using the described methods and techniques. Moreover, in different embodiments, a FeRAM cell or other suitable memory types may implement the described methods and techniques.

A FeRAM cell may store a memory state by charging the respective capacitor using an applied voltage. The FeRAM cell may sense a stored memory state by discharging the respective capacitor and reading a resulting sensing voltage. The memory cell may identify the respective memory state by comparing the applied voltage or the sensing voltage to a first reference voltage and a second reference voltage. In a first memory state, the applied voltage (e.g., programming voltage) or the sensed voltage (e.g., resulting voltage when sensing a stored memory state) may be higher than the first reference voltage and the second reference voltage. In a second memory state, the applied voltage or the sensed voltage may be between the first reference voltage and the second reference voltage. In a third memory state, the applied voltage or the sensed voltage may be lower than the first reference voltage and the second reference voltage. As such, the memory cell (e.g., ferroelectric memory cell) may store and retrieve three memory states.

Referring now to FIG. 1, a memory array 100 that supports multi-level accessing, sensing, and other operations for ferroelectric memory is illustrated in accordance with various examples of the present disclosure. The memory array 100 includes a number of memory cells, including a memory cell 105, that are programmable to store different states. The memory cell 105 may be programmable. In some embodiment, the memory cell 105 may store three memory states. In other embodiment, the memory cell 105 may store more than three memory states using the methods and techniques below.

The memory cell 105 may include a capacitor that has a ferroelectric as the dielectric material to store a charge representative of the programmable states. For example, the capacitor may represent three memory states using three distinct charge levels. In some embodiments, the dielectric material may accumulate intrinsic charges during memory operations. Such dielectric intrinsic charges may interfere with the capacitor charges when reading or writing a memory state. In different embodiments, intrinsic charges may accumulate on other portions of the memory cell 105 as well.

The memory cell 105 may store multiple charge levels using the ferroelectric capacitor to represent multiple memory states by compensating for the dielectric intrinsic charges. That is, by compensating for the dielectric intrinsic charges, the memory cell 105 may prevent interference between the three charge states. In some embodiments, the memory array 100 may implement plate pulse technique to compensate for dielectric intrinsic charges of one or more memory cells 105 when reading or writing data. For example, the memory array 100 may include circuitry to compensate for dielectric charges of the one or more memory cells 105. In another example, the one or more memory cells 105 may include additional circuitry to perform dielectric compensation.

In some embodiments, the multiple charge levels may require applying different voltage levels to perform memory operations. Memory operations, such as reading and writing memory states, may be performed on the memory cell 105 by activating or selecting the appropriate word line 110 and digit line 115. Activating or selecting a word line 110 or a digit line 115 may include applying a voltage to the respective lines. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of the memory cells is connected to a single word line 110, and each column of the memory cells is connected to a single digit line 115.

By applying a voltage to the word line 110 and the digit line 115, a single memory cell may be activated (or accessed) at their intersection. Accessing such memory cell may include performing reading or writing operation on the memory cell. The intersection of a word line 110 and digit line 115 may be referred to as an address of a respective memory cell. For example, a read operation may include sensing multiple charge levels from the memory cell 105. The operations may include compensating for the dielectric charge to reduce an amount of undesired intrinsic charges and allow sensing of multiple charge levels.

In some embodiment, the read operations may include specific bit sensing techniques with respect to a first reference voltage and a second reference voltage associated with reading from and/or writing to the memory cell 105 using multiple charge levels. The first reference voltage and the second reference voltage may facilitate indicating three memory states. For example, the read operations may include providing a voltage to discharge the memory cell 105 capacitor and comparing a resulting induced voltage (i.e., sensed voltage) to the first reference voltage and the second reference voltage. The memory cell 105 may include circuitry to compare the sensed voltage with the two reference voltages and facilitate indicating a first memory state, a second memory state, and a third memory state.

In some examples, a read operation may be performed based at least in part on a polarity of the polarization charge from the memory cell 105 indicated by the resulting induced voltage. That is, the first memory state may include a charge with positive polarization, the second memory state may include a charge with neutral polarization, and the third memory state may include a charge with negative polarization. Each of the polarization charges may induce a respective sensing voltage when performing the read operation. In some examples, the read operation may include accessing a cell to determine a polarity of a stored charge at a first time that may indicate an initial memory state and providing a respective programming voltage to alter the charge polarity to acquire a target memory state. In some cases, the reading operations of the different charge-related information may be performed concurrently, in overlapping intervals, in series, in continuous intervals, or in parallel.

In some architectures, the memory state storage of the memory cell 105 (e.g., the capacitor) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line 115 may then be accessed to either read or write the memory cell 105. In some examples, the word line 110 may be activated multiple times to facilitate sensing. In some cases, the word line 110 may be activated a first time to facilitate sensing of a first charge of a first type (e.g., dielectric charge) and a second time to facilitate sensing of a second charge of a second type (e.g., polarization charge). In some cases, the first time and the second time may be discontinuous or separated in time.

Accessing the memory cell 105 may be controlled through a respective row decoder 120 and a respective column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, the memory cell 105 may be read, or sensed, by sense component 125 to determine the stored state of the memory cell 105. For example, after accessing the memory cell 105, the ferroelectric capacitor of the memory cell 105 may discharge a first charge (e.g., a dielectric charge) onto its corresponding digit line 115. In other examples, after accessing the memory cell 105, the ferroelectric capacitor of memory cell 105 may discharge a second or third charge (e.g., a polarization charge) onto its corresponding digit line 115. Discharging the ferroelectric capacitor may be based on biasing, or applying a voltage, to the ferroelectric capacitor.

As described above, the discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in the memory cell 105 is related to a first predefined memory state. In some cases, the first memory state may include a state 1, or may be another value—including other logic values associated with multi-level sensing that enables storing more than two values (e.g., 3 states per cell or 1.5 bits per cell). In some examples, predefined encoding logic values may be mapped into memory cell states for writing to and reading from the memory cell as described with reference to aspects of the present disclosure. The sense component 125 may include various transistors or amplifiers in order to detect and amplify a difference in the signals, which may be referred to as latching. The detected logic state of the memory cell 105 may then be output through column decoder 130 as output 135.

In some examples, detecting and amplifying a difference in the signals, may include latching a first charge that is the sensed in sense component 125 at a first time. One example of this first charge may include latching a dielectric charge associated with the memory cell 105. As an example, the sense component 125 may sense a dielectric charge associated with the memory cell 105. The sensed dielectric charge may be latched in a latch within the sense component 125 or a separate latch that is in electronic communication with the sense component 125.

In some examples, detecting and amplifying a difference in the signals, may include latching a second charge that is sensed in the sense component 125 at a second time. One example of this second charge may include the polarization charges associated with the memory cell 105. The first and second charges may indicate either of the first memory state, the second memory state, or the third memory state. As an example, the sense component 125 may sense a polarization charge associated with the memory cell 105. The sensed polarization charge may be latched in a latch within the sense component 125 or a separate latch that is in electronic communication with the sense component 125. In other cases, this second charge is not latched, but is rewritten back to the memory cell 105.

The memory cell 105 may be set, or written, by activating the relevant word line 110 and digit line 115. As discussed above, activating a word line 110 electrically connects the corresponding row of memory cells to their respective digit lines 115. By controlling the relevant digit line 115 while the word line 110 is activated, the memory cell 105 may be written—i.e., a memory state may be stored in the memory cell 105. The column decoder 130 may accept data, for example input 135, to be written to the memory cells 105. The memory cell 105 may be written by applying a voltage across the ferroelectric capacitor. This process is discussed in more detail below. In some examples, the memory cell 105 may be written to include multiple charges after a read operation (e.g., based on a write-back operation).

In some cases, the memory cell 105 may be written after a read operation to write back data that has been read from the cell (or, alternatively, from other cells in some cases) or to refresh data. In some cases, a write operation may include writing a first charge (e.g., a first polarization charge) and a second charge (e.g., a dielectric compensation charge) to the memory cell 105. In some cases, writing one charge to the memory cell 105 may be based on a voltage of a cell plate relative to a voltage of one or more other components (e.g., a sense amplifier). In some cases, writing a first charge (e.g., a polarization charge) to a memory cell may occur before, during an overlapping interval, or at the same time as writing the second charge (e.g., a dielectric compensation charge) to the memory cell. In some cases, a write operation may be based on setting a polarization state, a dielectric state, or both, or by flipping one or more digits using cell or component selection.

In some memory architectures, accessing the memory cell 105 may degrade or destroy the stored logic state and re-write or refresh operations may be performed to return the original logic state to the memory cell 105. In DRAM, for example, the capacitor may be partially or completely discharged during a sense operation, corrupting the stored logic state. As such, the logic state may be re-written after a sense operation. Additionally, activating a single word line 110 may result in the discharge of all memory cells in the row: thus, several or all memory cells in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high. e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, the ferroelectric memory cells (e.g., memory cells 105) may have beneficial properties that may result in improved performance relative to other memory architectures.

For example, the ferroelectric memory cells may allow for storage of multiple charges. Storing these different states may allow for multi-level accessing, sensing, and other operations based on the charges, for example, by segmenting or dividing a related sense window. For example, as described above, the ferroelectric memory cells may store a positive polarity, a negative polarity, or a neutral charge distribution polarity. By performing various operations, the polarity and the value of each charge may be sensed and determined—allowing for multi-level storage and sensing. In some cases, this storage and sensing may be based on a dielectric-related charge compensation to allow storage of multiple distinct charge distributions to indicate multiple memory states. For example, a plate pulse technique may allow for storage and sensing of three or more distinct charge distributions indicative of three or more memory states.

The memory controller 140 may control the operation (e.g., read, write, re-write, refresh, etc.) of the memory cells 105 through the various components, such as the row decoder 120, the column decoder 130, and the sense component 125. The memory controller 140 may generate row and column address signals in order to activate the desired word line 110 and digit line 115. The memory controller 140 may also provide and control various voltage levels used during the operation of memory array 100. In general, the amplitude, shape, or duration of an applied voltage discussed herein may be adjusted or varied and may be different for the various operations for operating the memory array 100. Furthermore, one, multiple, or all memory cells within the memory array 100 may be accessed simultaneously; for example, multiple or all cells of the memory array 100 may be accessed simultaneously during a reset operation in which all memory cells, or a group of memory cells, are set to a single logic state.

Figure 2:
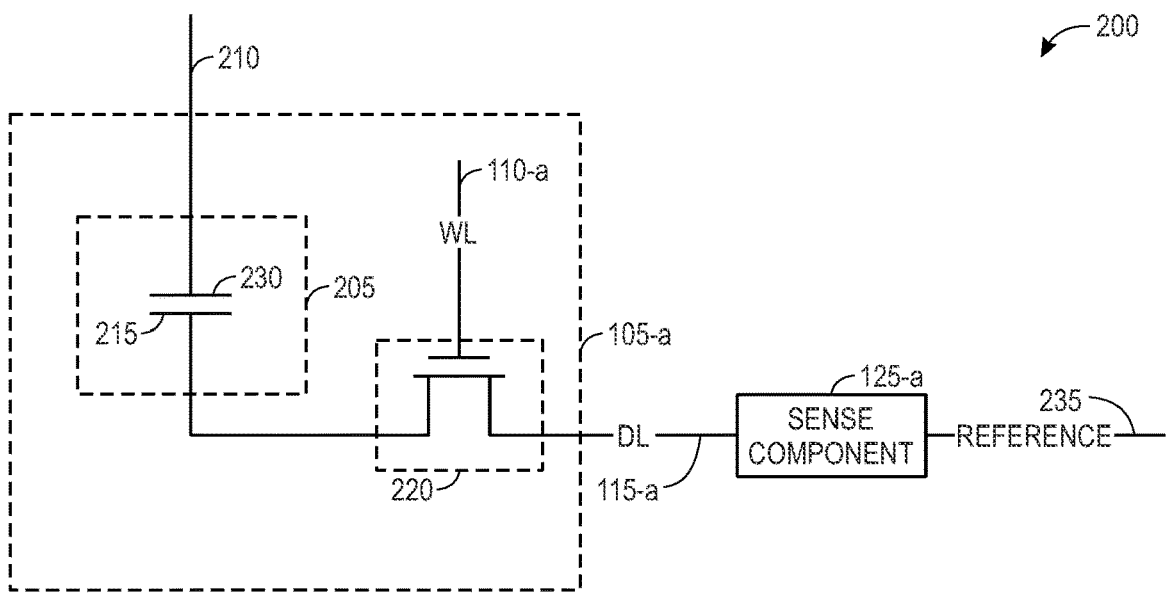
FIG. 2 illustrates an example circuit that supports multi-level accessing, sensing, and other operations for a memory that stores and retrieves three memory states, in accordance with an embodiment of the present disclosure.

FIG. 2 illustrates a circuit 200 that supports multi-level accessing, sensing, and other operations for ferroelectric memory in accordance with various examples of the present disclosure. The circuit 200 includes a ferroelectric memory cell 105-*a*, word line 110-*a*, digit line 115-*a*, and sense component 125-*a*, which may be examples of the memory cell 105, word line 110, digit line 115, and sense component 125, respectively, as described with reference to FIG. 1.

The ferroelectric memory cell 105-*a* may include a logic storage component, such as ferroelectric capacitor 205 that has a first plate, cell plate 230, and a second plate, cell bottom 215. The cell plate 230 and the cell bottom 215 may be capacitively coupled through a ferroelectric material positioned between them. The orientation of cell plate 230 and cell bottom 215 may be flipped without changing the operation of the ferroelectric memory cell 105-*a*. The circuit 200 may also include a selection component 220, a first reference voltage 225, and a second reference voltage 235. In the example of FIG. 2, the cell plate 230 may be accessed via the plate line 210 and the cell bottom 215 may be accessed via the digit line 115-*a*. As described above, various states may be stored by charging or discharging the ferroelectric capacitor 205.

The stored state of the ferroelectric capacitor 205 may be read or sensed by operating various elements represented in the circuit 200. The ferroelectric capacitor 205 may be in electronic communication with the digit line 115-*a*. For example, the ferroelectric capacitor 205 can be isolated from the digit line 115-*a* when the selection component 220 is deactivated, and the ferroelectric capacitor 205 can be connected to the digit line 115-*a* when the selection component 220 is activated. Activating the selection component 220 may be referred to as selecting the ferroelectric memory cell 105-*a*.

In some cases, the selection component 220 is a transistor and its operation is controlled by applying a voltage to the transistor gate, where the voltage magnitude is greater than the threshold magnitude of the transistor. The word line 110-*a* may activate the selection component 220; for example, a voltage applied to the word line 110-*a* is applied to the transistor gate, connecting the ferroelectric capacitor 205 with the digit line 115-*a*.

In an alternative embodiment, the positions of the selection component 220 and the ferroelectric capacitor 205 may be switched, such that the selection component 220 is connected between the plate line 210 and the cell plate 230 and such that the ferroelectric capacitor 205 is between the digit line 115-*a* and the other terminal of selection component 220. In this embodiment, the selection component 220 may remain in electronic communication with the digit line 115-*a* through the ferroelectric capacitor 205. This configuration may be associated with alternative timing and biasing for read and write operations.

In an example operation of the ferroelectric memory cell 105-*a*, a fixed or constant voltage may be applied to the cell plate 230 using the plate line 210—e.g., the fixed voltage may be half of the voltage supplied to the sense component 125-*a*. That is, the voltage applied to the plate line 210 may remain at a fixed voltage and may not be varied. This operation may be referred to as "fixed cell plate." In order to read the memory state of the ferroelectric memory cell 105-*a*, the digit line 115-*a* may be virtually grounded and subsequently isolated from virtual ground prior to applying a voltage to the word line 110-*a*.

As mentioned above, selecting the ferroelectric memory cell 105-*a* may result in a voltage difference across the ferroelectric capacitor 205, since the plate line 210 is held at a finite voltage and the digit line 115-*a* is virtually grounded. The voltage difference may be the induced voltage or sensed voltage discussed above. Moreover, the voltage difference value may refer to one of multiple sensing voltages, corresponding to one of multiple distinct charge distributions in the ferroelectric memory cell 105-*a*, and indicative of the multiple memory states. As a result, the voltage of the digit line 115-*a* may change, e.g., become some finite value. In some embodiments, this induced voltage may be compared at the sense component 125-*a* with a first reference voltage and a second reference voltage to determine a first, second, or third memory state. In other embodiments, the induced voltage may be compared to more than two reference voltages to identify between a different number of memory states.

Due to the ferroelectric material between the plates of the ferroelectric capacitor 205, and as discussed in more detail below, the ferroelectric capacitor 205 may not discharge upon connection to the digit line 115-*a*. In one scheme, to sense the logic state stored by the ferroelectric capacitor 205, the word line 110-*a* may be biased to select the ferroelectric memory cell 105-*a* and a voltage may be applied to the plate line 210. In some cases, digit line 115-*a* is virtually grounded and then isolated from the virtual ground (i.e., "floating") prior to biasing plate line 210 and word line 110-*a*.

Biasing plate line 210 may result in a voltage difference (e.g., plate line 210 voltage minus digit line 115-*a* voltage) across the ferroelectric capacitor 205. The voltage difference may yield a change in the stored charge on the ferroelectric capacitor 205, where the magnitude of the change in stored charge may depend on the initial state of the ferroelectric capacitor 205—e.g., whether the initial state stored a predefined logic value (e.g., the first memory state, the second memory state, the third memory state, etc.). This may induce a change in the voltage of digit line 115-*a* based on the charge stored on the ferroelectric capacitor 205.

The change in voltage of the digit line 115-*a* may depend on its intrinsic capacitance (e.g., ferroelectric dielectric capacitance)—as charge flows through the digit line 115-*a*, some finite charge may be stored in the digit line 115-*a* and the resulting voltage depends on the intrinsic capacitance. The intrinsic capacitance may depend on physical characteristics, including the dimensions, of the digit line 115-*a*. The digit line 115-*a* may connect to a number of memory cells and the digit line 115-*a* may have a length that results in a non-negligible capacitance (e.g., on the order of picofarads (pF)). The resulting voltage of the digit line 115-*a* may then be compared to the reference voltages (e.g., the first reference voltage 225 and the second memory state 235) by the sense component 125-*a* in order to determine the stored memory state in the ferroelectric memory cell 105-*a*.

The sense component 125-*a* may include various transistors or amplifiers to detect and amplify a difference in signals. For example, the sense component 125-*a* may include an amplifier that receives, amplifies, and outputs the voltage of digit line 115-*a*. A first and a second latch circuits may receive and compare the amplified voltage with the first reference voltage 225 and the second reference voltage 235 to provide output signals to indicate the first memory state, the second memory state, or the third memory state.

In a first example, when the digit line 115-*a* has a voltage higher than the first reference signal 225 and the second reference voltage 235, the first and second latch circuit outputs may be driven to a logic high voltage. In the first example, the voltage of the digit line 115-*a* may be referred to as a first sensing voltage. In a memory write operation, the logic high voltage of the first and second latch circuits may facilitate writing (or programming) the first memory state to the ferroelectric memory cell 105-*a*, as will be appreciated. As such, the ferroelectric memory cell 105-*a* may accumulate a first amount of charge within the positive charge distribution range.

In a second example, when the digit line 115-*a* has a voltage higher than the first reference signal 225 and lower than the second reference voltage 235, the first latch circuit output may be driven to a logic high voltage and the second latch circuit output may be driven to a logic low voltage. In the second example, the voltage of the digit line 115-*a* may be referred to as a second sensing voltage lower than and distinct from the first sensing voltage. In a memory write operation, the logic high voltage of the first latch circuit and the logic low voltage of the second latch circuit may facilitate writing (or programming) the second memory state to the ferroelectric memory cell 105-*a*, as will be appreciated. As such, the ferroelectric memory cell 105-*a* may accumulate a second amount of charge within the neutral charge distribution range. In different embodiments, the neutral charge distribution may include different charge distribution ranges between the positive and the negative charge distributions.

In a third example, when the digit line 115-*a* has a voltage lower than the first reference signal 225 and the second reference voltage 235, the first and second latch circuit outputs may be driven to a logic low voltage. In the third example, the voltage of the digit line 115-*a* may be referred to as a third sensing voltage lower than and distinct from the first sensing voltage and the second sensing voltage. In a memory write operation, the logic low voltage of the first and second latch circuits may facilitate writing (or programming) the third memory state to the ferroelectric memory cell 105-*a*, as will be appreciated. As such, the ferroelectric memory cell 105-*a* may accumulate a third amount of charge within the negative charge distribution range. In different embodiments, the negative charge distribution may include different charge distribution ranges lower than the positive and the neutral charge distributions. It should be appreciated that the mention of positive, neutral, and, negative charge distributions are relative and in different embodiments, distinct charge distributions with different charge distribution ranges may be used.

With regard to the fixed cell plate scheme, writing on the ferroelectric memory cell 105-*a* may include activating the selection component 220 and biasing the cell bottom 215 using the digit line 115-*a*. In some cases, the fixed voltage magnitude of the cell plate 230 may be a value between the supply voltages of the sense component 125-*a*. The sense component 125-*a* may be used to drive the voltage of the digit line 115-*a* to the first sensing voltage, the second sensing voltage, or the third sensing voltage. It should be appreciated that more than three sensing voltages may be implemented in other embodiments.

For instance, to write a first predefined logic value related to a polarization value (e.g., a state 0, or the first memory state of three or more possible values), the cell bottom 215 may be taken low, that is, the voltage of the digit line 115-*a* may be driven to the low supply voltage. Moreover, to write a second predefined memory state related to a polarization value (e.g., the second memory state, or a second predefined logic value of three or more possible values), the cell bottom 215 may be taken high—e.g., the voltage of the digit line 115-*a* may be driven to the high supply voltage.

To write to the ferroelectric memory cell 105-a, a voltage may be applied across the ferroelectric capacitor 205 to induce accumulation of the respective amount of charges. Various methods may be used to induce accumulation of the respective amount of charges. In one example, the selection component 220 may be activated through word line 110-a in order to electrically connect the ferroelectric capacitor 205 to the digit line 115-a. A voltage may be applied across the ferroelectric capacitor 205 by controlling the voltage of the cell plate 230 (through the plate line 210) and the cell bottom 215 (through the digit line 115-a). The differential voltage between the cell plate 230 and the cell bottom 215 may be driven to the first sensing voltage to write the first memory state (or a first predefined logic value of three or more possible values).

A similar process may be performed to write the second and third memory states. That is, the differential voltage between the cell plate 230 and the cell bottom 215 may be driven to a voltage within the second sensing voltage or the third sensing voltage respectively. As such, the first amount of charges, the second amount of charges, or the third amount of charges may be induced to the ferroelectric memory cell 105-a, as will be appreciated.

Figure 3B:
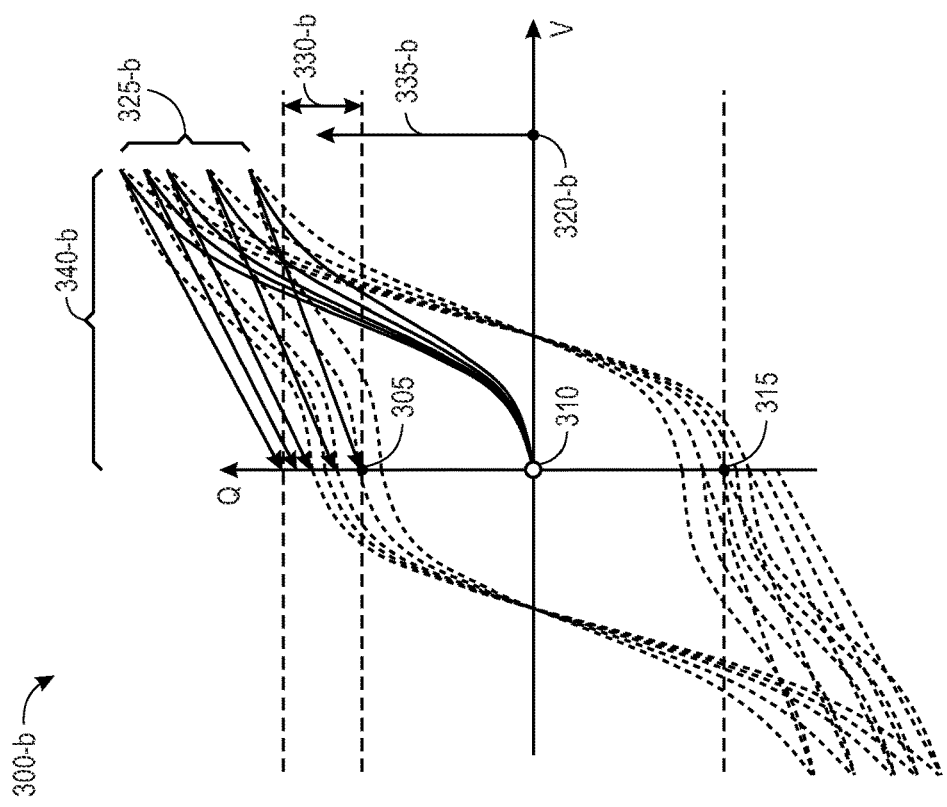
FIG. 3B depicts sensing operation of a second memory state of the memory cell for a memory that stores and retrieves three memory states, in accordance with another embodiment of the present disclosure.
Figure 3A:
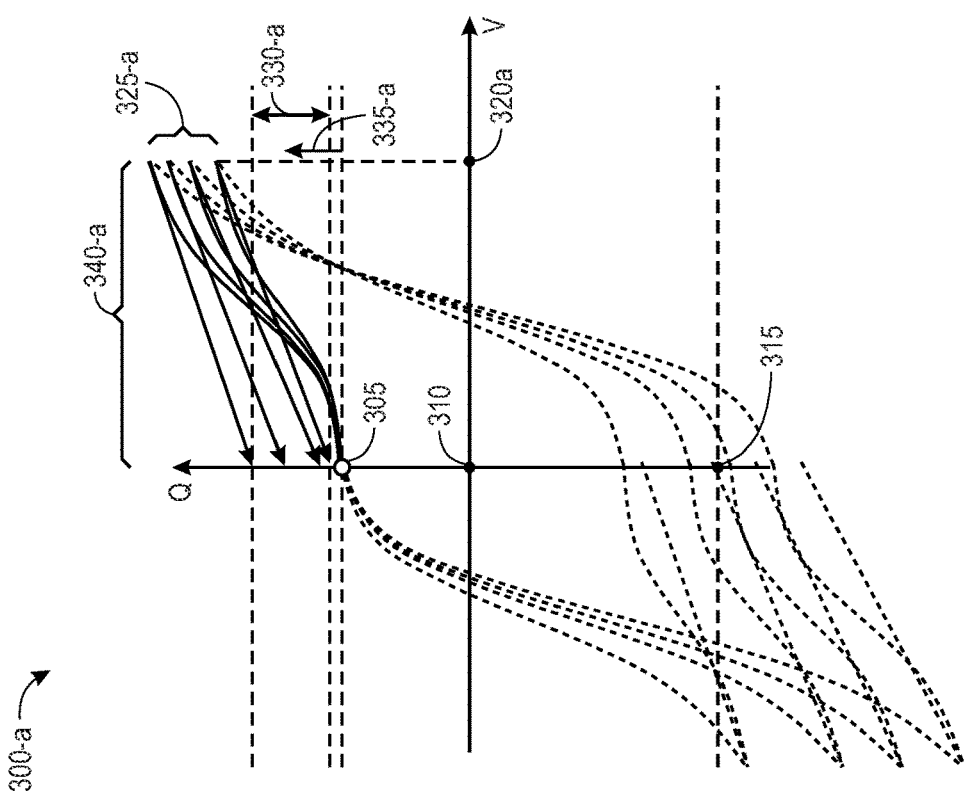
FIG. 3A depicts sensing operation of a first memory state of a memory cell for a memory that stores and retrieves three memory states, in accordance with an embodiment of the present disclosure.
Figure 3C:
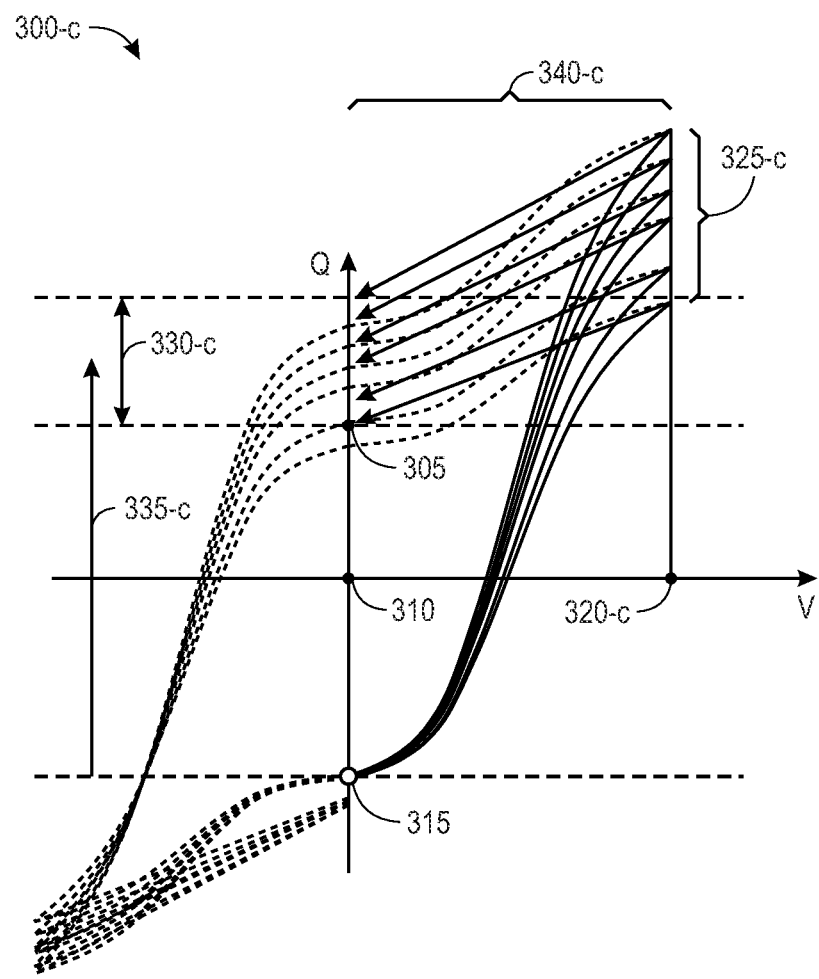
FIG. 3C depicts sensing operation of a third memory state of the memory cell for a memory that stores and retrieves three memory states, in accordance with yet another embodiment of the present disclosure.

FIG. 3A, FIG. 3B, and FIG. 3C illustrate examples of electrical properties of ferroelectric memory cells with hysteresis curves 300-a, 300-b, and 300-c, and may be collectively referred to as "FIG. 3". The hysteresis curves 300-a, 300-b, and 300-c may each illustrate an example sensing process when a first, second, and third memory state is stored on a respective memory cell (e.g., the ferroelectric memory cell 105-a). The hysteresis curves 300-a. 300-b, and 300-c may depict a charge stored on a ferroelectric capacitor (e.g., capacitor 205 of FIG. 2) as a function of voltage. A dielectric compensation technique, such as plate pulse technique, may be used to compensate for the ferroelectric dielectric intrinsic charge.

Example ferroelectric materials may include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric charge distribution within a ferroelectric capacitor may result in accumulation of a net charge at the ferroelectric material's surface that attracts opposite charge through the capacitor terminals. Thus, the respective charge is stored at the interface of the ferroelectric material and the capacitor terminals.

In some embodiments, ferroelectric material may maintain an electric charge distribution in the absence of an electric field. For example, the ferroelectric material may maintain a positive, neutral, or negative charge (i.e., three memory states) at neutral voltage. The ferroelectric material may realize such electric charge levels by receiving a respective programming or sensing voltage level. The respective sensing voltage levels may be applied according to the hysteresis curves 300-a, 300-b, or 300-c, as will be appreciated. In some embodiments, the respective programming voltage levels may be similar to the respective sensing voltage levels and the operations may be opposite the sensing operation described below with respect to FIG. 3A, FIG. 3B, and FIG. 3C.

Ferroelectric memory cell hysteresis curves, such as hysteresis curves 300-a, 300-b, and 300-c may be described from the perspective of a single terminal of a ferroelectric capacitor (capacitor hereinafter). Positive charge may accumulate at the terminal of the capacitor when the ferroelectric material has a negative charge distribution. Similarly, neutral charge (e.g., approximately 0 net charge) may accumulate at the terminal of the capacitor when the ferroelectric material has a neutral charge distribution. Additionally, negative charge may accumulate at the terminal of the capacitor when the ferroelectric material has a positive charge distribution. It should be appreciated that in other embodiments, more than three charge distributions may be programmed and sensed from the ferroelectric memory cell. In such embodiments, multiple positive and/or negative charge distributions may be implemented.

The applied voltages in hysteresis curves 300-a, 300-b, and 300-c may represent an applied voltage difference across the capacitor. Additionally, the applied voltages may be directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal. That is, positive voltages may be applied to negatively polarize the described terminal. Similarly, two positive voltages, two negative voltages, or any combination of positive and negative voltages may be applied to the appropriate capacitor terminals to generate the voltage difference shown in hysteresis curves 300-a, 300-b, and 300-c.

The ferroelectric material may maintain a positive, neutral, or negative charge distribution at neutral voltage (i.e., a zero voltage difference between terminals of the capacitor) referring to respective memory states. For example, the memory cell may maintain a first memory state 305 (e.g., by maintaining positive charge distribution), a second memory state 310 (e.g., by maintaining neutral charge distribution), or a third memory state 315 (e.g., by maintaining negative charge distribution) when no voltage is applied across the terminals of the capacitor.

FIG. 3A depicts a sensing operation of the first memory state 305 of a memory cell (e.g., the ferroelectric memory cell 105-a) according to one embodiment of the present disclosure. The first memory state 305 may refer to a first charge domain in the memory cell. The sensing operation may include applying a sensing voltage 320-a (e.g., first sensing voltage) to the ferroelectric material. Applying the sensing voltage 320-a to the memory cell may result in an accumulated charge in the capacitor of the memory cell.

In different embodiments, a value of the accumulated charge may be slightly different due to different real-life variables of the memory cell. However, the sensing voltage 320-a may be set to a predetermined value corresponding to an average net charge associated with sensing the first memory state 305. Accordingly, a sensing area 325-a may represent a range of acceptable accumulated charge values for successfully performing the sensing operation. It should be noted that the acceptable accumulated charge value and the sensing voltage 320-a may be different in different embodiments.

By applying the sensing voltage 320-a, the accumulated charge value may reach the sensing area 325-a by following a path 340-a using the hysteresis curve 300-a. Subsequently, the sensing voltage 320-a may be removed. In the depicted embodiment of FIG. 3A, the accumulated charge value may follow the path 340-a on the hysteresis curve 300-a back to the first memory state 305 when the sensing voltage 320-a is removed from the memory cell. In other embodiments, removing the sensing voltage 320-a may result in a different memory state, such as second memory state 310 or third memory state 315. The second memory state 310 and the third memory state 315 may refer to a second charge domain and a third charge domain in the memory cell, respectively, as will be appreciated.

Referring back to the embodiment of FIG. 3A, the sensing operation may include measuring a net charge when the charge value tracks the hysteresis curve 300-a via the path 340-a from first memory state 305 to the sensing area 325-a and back to the first memory state 305. However, in different embodiments, the net charge may be different due to different characteristics of such embodiments. As such, a net charge spread 330-a may represent a range of acceptable charge values after applying and removing the sensing voltage 320-a for successfully performing the sensing operation.

An average net charge 335-a may represent an average differential charge level between the charge level of the first memory state 305 and the final state of the charge after applying and removing the sensing voltage 320-a in different embodiments. That is, the average net charge 335-a may be an average of the resulting net charges for successfully sensing the first memory state 305 in different embodiments. Accordingly, the memory array (e.g., memory array 100) may sense the positive electric polarization of the stored charge (i.e., the first memory state 305) by measuring the average net charge 335-a and correlating the measured average net charge 335-a and the applied sensing voltage 320-a. The first memory state 305 may be referred to as remnant polarization (Pr) values. That is, the first memory state 305 may retain the respective polarization or charge distribution values after removing the external bias (e.g., voltage).

That said, the memory cell may include additional charges associated with a dielectric of the memory cell. For example, the dielectric may be a ferroelectric dielectric made from ferroelectric material. Thus, the memory cell may include a dielectric charge and a polarization charge. In some embodiments, the dielectric charge may correspond to or track the applied voltage. If left uncompensated, the dielectric charge may interfere with the relationship between the applied sensing voltage 320-a and the accumulated charges.

Implementation and detection of the three memory states with the memory cell is achieved based at least in part on compensating for the ferroelectric dielectric charge. Compensating for the ferroelectric dielectric charge may result in a smaller charge distribution window for the net charge spread 330-a. Subsequently, the smaller charge distribution window of the net charge spread 330-a may result in wider distance between the average net charge 335-a and an average net charges associated with sensing the second memory state 310 and the third memory state 315, as will be appreciated.

Moreover, in different embodiments, the memory cell may maintain or destroy the initial memory state by performing the sense operation as discussed above. For example, upon removing the sensing voltage 320-a, the net charge may follow a different path according to the hysteresis curve 300-a to reach different charge levels and memory states. In the example described above with respect to FIG. 3A, the net charge of the memory cell may follow the depicted path 340-a on the hysteresis curve 300-a to reach the first memory state 305 at zero voltage potential. In a different example, the net charge of the memory cell may follow a different path to reach the second memory state 310 at zero voltage potential. In yet another example, the net charge of the memory cell may follow a different path to reach the third memory state 315 at zero voltage potential. In such examples, the respective memory array (e.g., the memory array 100) may rewrite such destroyed memory state to the initial memory state (e.g., the first memory state 305).

The memory cell may perform similar operations for writing (or rewriting) the first memory state 305. For example, the memory array may perform the write operation by applying a voltage (e.g., similar or equal to the sensing voltage 320-a) that may result in an accumulated charge value according to a path the hysteresis curve 300-a. After removing the applied voltage, the charge value may follow a path on the hysteresis curve 300-a until it reaches the first memory state 305 at zero voltage. Moreover, the memory cell 105 may measure a resulting net charge and write a respective memory state to the respective capacitor by corresponding the measured net charge to the applied voltage.

FIG. 3B depicts a sensing operation of the second memory state 310 of the memory cell according to another embodiment of the present disclosure. Similar to the sensing operation of the first memory state 305, the sensing operation may include applying a sensing voltage 320-b (e.g., second sensing voltage) to the ferroelectric material. Applying the sensing voltage 320-b to the memory cell may result in a respective accumulated charge in the capacitor of the memory cell. In different embodiments, a value of the accumulated charge may be slightly different due to different real-life variables of the memory cell. However, the sensing voltage 320-b may be set to a predetermined value corresponding to an average net charge associated with sensing the second memory state 310, as will be appreciated. Accordingly, a sensing area 325-b may represent a range of acceptable accumulated charge values for successfully performing the sensing operation when sensing the second memory state 310. It should be noted that the acceptable accumulated charge value and the sensing voltage 320-b may be different in different embodiments.

By applying the sensing voltage 320-b, the accumulated charge value may reach the sensing area 325-a by following a path 340-b using the hysteresis curve 300-b. Subsequently, the sensing voltage 320-b may be removed. In the depicted embodiment of FIG. 3B, the accumulated charge value may follow the path 340-b on the hysteresis curve 300-b to the first memory state 305 when the sensing voltage 320-b is removed from the memory cell. In other embodiments, removing the sensing voltage 320-b may result in a different memory state, such as back to the second memory state 310 or the third memory state 315.

Referring back to the embodiment of FIG. 3B, the sensing operation may include measuring a net charge when the charge value tracks the hysteresis curve 300-b via the path 340-b from second memory state 310 to the sensing area 325-b and subsequently to the first memory state 305. However, in different embodiments, the net charge may be different due to different characteristics of such embodiments. As such, a net charge spread 330-b may represent a range of acceptable charge values after applying and removing the sensing voltage 320-b for successfully performing the sensing operation.

An average net charge 335-b may represent an average differential charge level between the charge level of the second memory state 310 and the final state of the charge after applying and removing the sensing voltage 320-b in different embodiments. That is, the average net charge 335-b may be an average of the resulting net charges for successfully sensing the second memory state 310 in different embodiments. Accordingly, the memory array (e.g., memory array 100) may sense the neutral electric polarization of the stored charge (i.e., the second memory state 310) by measuring the average net charge 335-*b* and correlating the measured average net charge 335-*b* and the applied sensing voltage 320-*b*.

As discussed above, the sense operation of the second memory state 310 may be destructive. That is, applying and removing the sensing voltage 320-*b* to the memory cell may result in a final memory state different from the initial memory state. In the depicted example, the final memory state may be the first memory state 305. As such, the memory cell may perform a re-write operation to restore the initial state (i.e., second memory state 310) to the memory cell after sensing the stored memory state. The second memory state 310 may also be referred to as remnant polarization (Pr) values. That is, the second memory state 310 may retain the respective polarization or charge distribution values after removing the external bias (e.g., voltage).

That said, the memory cell may include additional charges associated with a dielectric of the memory cell. For example, the dielectric may be a ferroelectric dielectric made from ferroelectric material. Thus, the memory cell may include a dielectric charge and a polarization charge. In some embodiments, the dielectric charge may correspond to or track the applied voltage. If left uncompensated, the dielectric charge may interfere with the relationship between the applied sensing voltage 320-*b* and the accumulated charges.

Compensating for the ferroelectric dielectric charge may result in a smaller charge distribution window for the net charge spread 330-*b*. Subsequently, the smaller charge distribution window of the net charge spread 330-*b* may result in wider distance between the average net charge 335-*b*, the average net charge 335-*a* associated with the first memory state 305, and an average net charge associated with the third memory state 315, as will be appreciated.

Moreover, in different embodiments, upon removing the sensing voltage 320-*b*, the net charge may follow a different path according to the hysteresis curve 300-*b* to reach different charge levels and memory states. For example, the net charge of the memory cell may follow a different path to reach the second memory state 310 at zero voltage potential. In another example, the net charge of the memory cell may follow a different path to reach the third memory state 315 at zero voltage potential. In some examples, the respective memory array (e.g., the memory array 100) may rewrite a destroyed memory state to the initial memory state (e.g., the second memory state 310).

The memory cell may perform similar operations for writing (or rewriting) the second memory state 310. For example, the memory array may perform the write operation by applying a voltage (e.g., similar or equal to the sensing voltage 320-*b*) that may result in an accumulated charge value according to the hysteresis curve 300-*b*. After removing the applied voltage, the charge value may follow a path on the hysteresis curve 300-*b* until it reaches the second memory state 310 at zero voltage. Moreover, the memory cell 105 may measure a resulting net charge and write a respective memory state to the respective capacitor by corresponding the measured net charge to the applied voltage.

FIG. 3C depicts a sensing operation of the third memory state 315 of the memory cell according to yet another embodiment of the present disclosure. Similar to the sensing operation of the first memory state 305 and the second memory state 310, the sensing operation may include applying a sensing voltage 320-*c* (e.g., third sensing voltage) to the ferroelectric material. Applying the sensing voltage 320-*c* to the memory cell may result in a respective accumulated charge in the capacitor of the memory cell. In different embodiments, a value of the accumulated charge may be different due to different real-life variables of the memory cell. However, the sensing voltage 320-*c* may be set to a predetermined value corresponding to an average net charge associated with sensing the third memory state 315, as will be appreciated. Accordingly, a sensing area 325-*c* may represent a range of acceptable accumulated charge values for successfully performing the sensing operation when sensing the third memory state 315. It should be noted that the acceptable accumulated charge value and the sensing voltage 320-*c* may be different in different embodiments.

By applying the sensing voltage 320-*c*, the accumulated charge value may reach the sensing area 325-*c* by following a path 340-*c* using the hysteresis curve 300-*c*. Subsequently, the sensing voltage 320-*c* may be removed. In the depicted embodiment of FIG. 3C, the accumulated charge value may follow the path 340-*c* on the hysteresis curve 300-*c* to the first memory state 305 when the sensing voltage 320-*c* is removed from the memory cell. In other embodiments, removing the sensing voltage 320-*c* may result in a different memory state, such as the second memory state 310 or back to the third memory state 315.

Referring back to the embodiment of FIG. 3C, the sensing operation may include measuring a net charge when the charge value tracks the hysteresis curve 300-*c* via the path 340-*c* from third memory state 315 to the sensing area 325-*c* and subsequently to the first memory state 305. However, in different embodiments, the net charge may be different due to different characteristics of such embodiments. As such, a net charge spread 330-*c* may represent a range of acceptable charge values after applying and removing the sensing voltage 320-*c* for successfully performing the sensing operation.

An average net charge 335-*c* may represent an average differential charge level between the charge level of the third memory state 315 and the final state of the charge after applying and removing the sensing voltage 320-*c* in different embodiments. That is, the average net charge 335-*c* may be an average of the resulting net charges for successfully sensing the third memory state 315 in different embodiments. Accordingly, the memory array (e.g., memory array 100) may sense the negative electric polarization of the stored charge (i.e., the third memory state 315) by measuring the average net charge 335-*c* and correlating the measured average net charge 335-*c* and the applied sensing voltage 320-*c*. It should be appreciated that because the resulting memory state after performing the sense operation may be different in different embodiments, sensing the electric polarization may be with respect to different values. However, the hysteresis curve of such different embodiments may incorporate the similar shape when using a ferroelectric memory cell.

As discussed above, the sense operation of the second memory state 310 may be destructive. That is, applying and removing the sensing voltage 320-*c* to the memory cell may result in a final memory state different from the initial memory state. In the depicted example, the final memory state may be the first memory state 305. As such, the memory cell may perform a re-write operation to restore the initial state (i.e., third memory state 315) to the memory cell after sensing the stored memory state. The third memory state 315 may also be referred to as remnant polarization (Pr) values. That is, the third memory state 315 may retain the respective polarization or charge distribution values after removing the external bias (e.g., voltage).

Similar to the embodiments discussed above, the memory cell may include additional charges associated with a dielectric of the memory cell. For example, the dielectric may be a ferroelectric dielectric made from ferroelectric material. Thus, the memory cell may include a dielectric charge and a polarization charge. In some embodiments, the dielectric charge may correspond to or track the applied voltage. If left uncompensated, the dielectric charge may interfere with the relationship between the applied sensing voltage 320-c and the accumulated charges.

Compensating for the ferroelectric dielectric charge may result in a smaller charge distribution window for the net charge spread 330-c. Subsequently, the smaller charge distribution window of the net charge spread 330-c may result in wider distance between the average net charge 335-c, the average net charge 335-a associated with sensing the first memory state 305, and the average net charge 335-b associated with sensing the second memory state 310.

Moreover, in different embodiments, upon removing the sensing voltage 320-c, the net charge may follow a different path according to the hysteresis curve 300-c to reach different charge levels and memory states. For example, the net charge of the memory cell may follow a different path to reach the second memory state 310 at zero voltage potential. In another example, the net charge of the memory cell may follow a different path to reach the third memory state 315 at zero voltage potential. In some examples, the respective memory array (e.g., the memory array 100) may rewrite a destroyed memory state to the initial memory state (e.g., the third memory state 315).

The memory cell may perform similar operations for writing (or rewriting) the third memory state 315. For example, the memory array may perform the write operation by applying a voltage (e.g., similar or equal to the sensing voltage 320-c) that may result in an accumulated charge value according to the hysteresis curve 300-c. After removing the applied voltage, the charge value may follow a path on the hysteresis curve 300-c until it reaches the third memory state 315 at zero voltage. Moreover, the memory cell 105 may measure a resulting net charge and write a respective memory state to the respective capacitor by corresponding the measured net charge to the applied voltage.

Figure 4A:
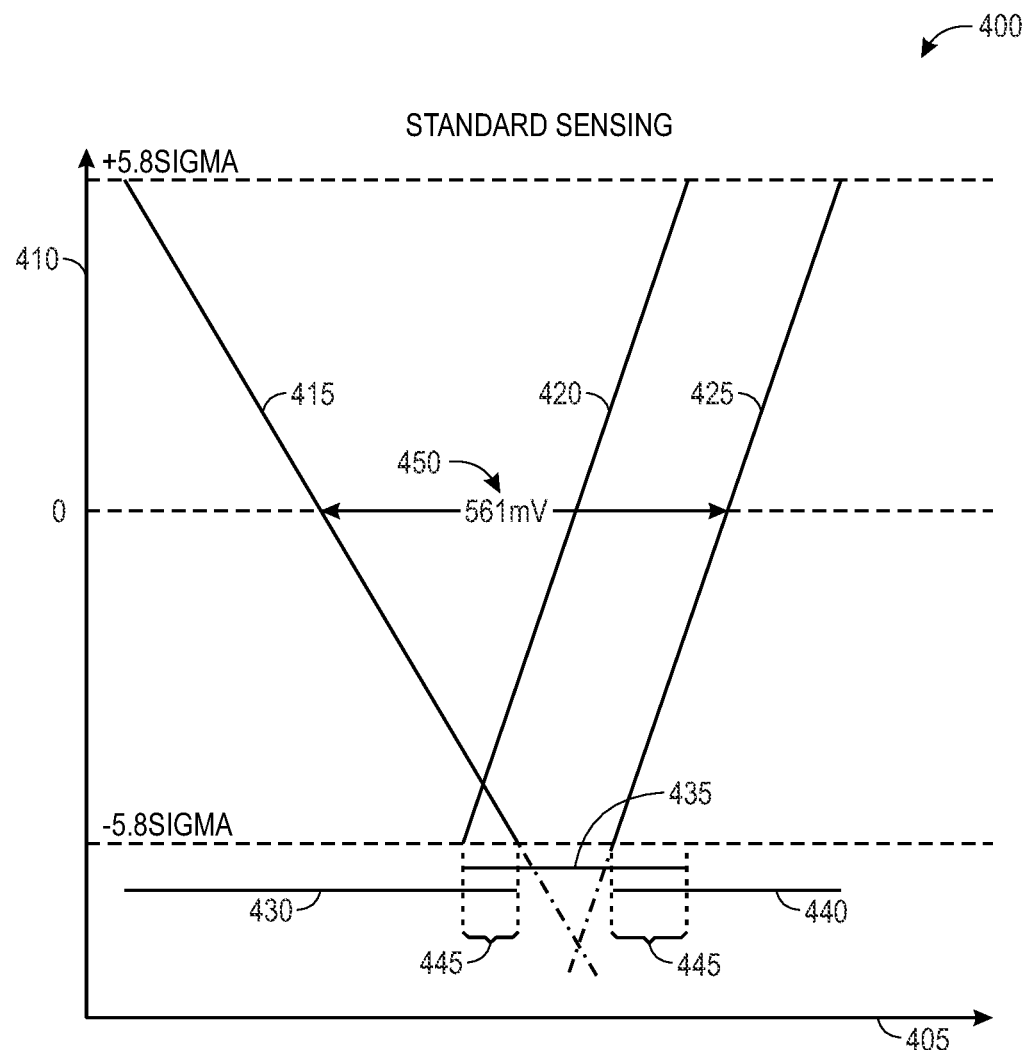
FIG. 4A depicts a graph including a voltage distribution bar and a bit error rate distribution bar to illustrate a respective bit error ratio of a respective memory state when applying a respective sensing voltage, in accordance with an embodiment of the present disclosure.
Figure 4B:
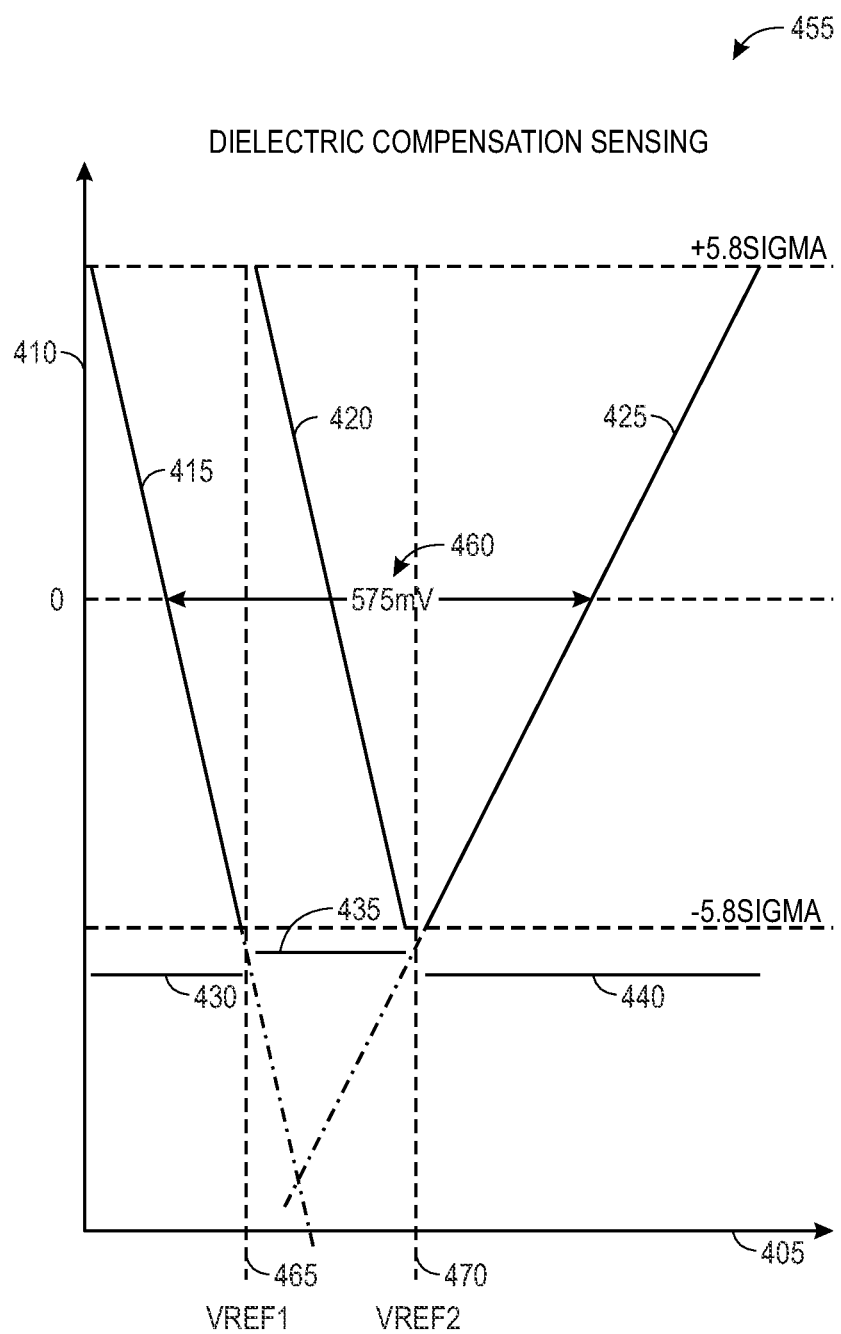
FIG. 4B depicts a graph illustrating a first memory state error distribution, a second memory state error distribution, and a third memory state error distribution after compensation for the dielectric charge, in accordance with another embodiment of the present disclosure.

FIG. 4A and FIG. 4B illustrate a graph 400 and a graph 455, respectively, and may be collectively referred to as "FIG. 4". The graph 400 may be associated with a sensing operation before dielectric charge compensation, and the graph 455 may be associated with another sensing operation after dielectric charge compensation. In one embodiment, the graph 400 and the graph 455 may both illustrate a relationship between sensing voltages associated with each of the three memory states described above and an associated bit error rate.

Referring now to the FIG. 4A, the graph 400 may include a voltage distribution bar 405 and a bit error rate distribution bar 410 to illustrate a respective bit error ratio when applying a respective sensing voltage. The graph 400 may illustrate the relationship between the sensing voltages, such as the sensing voltages 320-a, 320-b, and 320-c, and the respective bit error rate distributions during a sensing operation. The voltage distribution bar 405 may illustrate a range of voltage values associated with the respective sensing voltages of different memory states.

In some embodiments, a voltage value of the sensing voltage 320-a may be within a first voltage distribution 430 range. Moreover, a voltage value of the sensing voltage 320-b may be within a second voltage distribution 435 range. Furthermore, a voltage value of the sensing voltage 320-c may be within a third voltage distribution 440 range. As mentioned above with respect to FIG. 3, the sensing voltages 320-a, 320-b, and 320-c may be discussed with respect to an average acceptable voltage for successful memory sense operation. However, the first voltage distribution 430, the second voltage distribution 435, and the third voltage distribution 440 may each include a range of acceptable sensing voltages associated with the respective memory states. The bit error rate distribution bar 410 may indicate a likelihood of failure associated with the respective sensing voltages and the respective voltage distributions.

The graph 400 may include a first memory state error distribution 415, a second memory state error distribution 420, and a third memory state error distribution 425. The first memory state error distribution 415 may correspond the first voltage distribution 430 with the respective bit error rate. Moreover, the second memory state error distribution 420 may correspond the second voltage distribution 435 with the respective bit error rate. Furthermore, the third memory state error distribution 425 may correspond the third voltage distribution 440 with the respective bit error rate.

As mentioned above, the graph 400 may illustrate the first memory state error distribution 415, the second memory state error distribution 420, and the third memory state error distribution 425 before compensation for the dielectric charge. The dielectric charges may result in an increased range of voltages at the first voltage distribution 430, second voltage distributions 435, and the third voltage distributions 440. As such, the first memory state 305, the second memory state 310, and the third memory state 315 may include overlapping boundaries 445 between the first voltage distribution 430, second voltage distribution 435, and the third voltage distribution 440. The overlapping boundaries 445 may be undesirable and may cause erroneous memory state sensing operations. In one specific example, a differential voltage 450 between the first memory state error distribution 415 and the third memory state error distribution 425, at zero bit error rate, may be 561 milli-volts. The differential voltage 450 may not be sufficient for distinctly fitting the second memory state error distribution 420.

FIG. 4B depicts the graph 455 that may include the first memory state error distribution 415, the second memory state error distribution 420, and the third memory state error distribution 425 after compensation for the dielectric charge. Compensating for the dielectric charges may result in reduced range of voltages for switching between the memory states. The first voltage distribution 430, the second voltage distribution 435, and the third voltage distribution 440 may attain the respective memory states using a reduced range of voltage distributions. As such, a differential voltage 460 between the first memory state error distribution 415 and the third memory state error distribution 425, at zero bit error rate, may become sufficient for distinctly fitting the second memory state error distribution 420. That is, an increased voltage distance between the first memory state error distribution 415 and the third memory state error distribution 425 may facilitate fitting an intermediary memory state (e.g., the second memory state 310) with no overlapping boundaries between the memory states. For example, the differential voltage 460 may become 575 milli-volts.

That said, the graph 455 may include a first reference voltage 465 and a second reference voltage 470 between the programming voltage distributions. The first reference voltage 465 may be a threshold voltage between the first voltage distribution 430 and the second voltage distribution 435. The second reference voltage 470 may be another threshold voltage between the second voltage distribution 435 and the third voltage distribution 440. For example, the first reference voltage 465 may be associated with a first latch circuit and the second reference voltage 470 may be associated with a second latch circuit to attain the three memory states, as discussed above with respect to FIG. 2. As such, the memory array may distinctively sense the first memory state 305, the second memory state 310, and the third memory states 315. In other embodiments, more than two reference voltages may be used to identify a different number of memory states in a respective memory cell.

Figure 5:
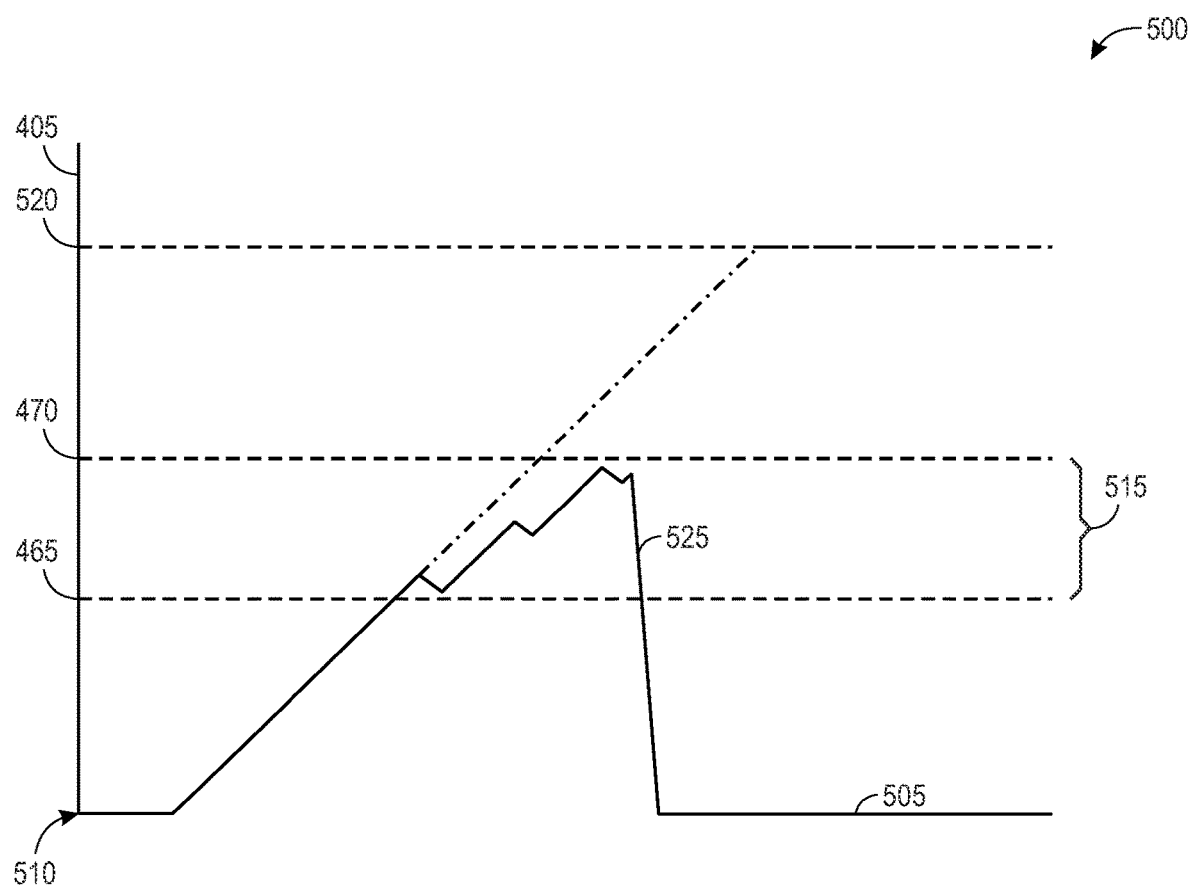
FIG. 5 depicts a graph illustrating a voltage ramp for programming three distinct memory states on the memory cell described above, in accordance with an embodiment of the present disclosure.

Referring now to FIG. 5, a graph 500 may illustrate a voltage ramp for programming three distinct memory states on the memory cell described above, with respect to some embodiments of the present disclosure. The graph 500 may illustrate three voltage levels for programming a memory cell (e.g., the memory cell 105). For example, the memory array 100 may maintain or switch a current memory state between the three memory states (e.g., the memory states 305, 310, and 315) using the voltage ramp of graph 500, as will be appreciated. It should be noted that in other embodiments, different voltage ramps with different programming voltage levels may be used.

The graph 500 may include the voltage distribution bar 405 and a time bar 505. The graph 500 may illustrate different voltage levels for switching between the three memory states using the first voltage distribution 430, the second voltage distribution 435, and the third voltage distribution 440 with respect to time. The first voltage distribution 430, the second voltage distribution 435, and the third voltage distribution 440 may correspond to the sensing voltages 320 as described above with respect to FIGS. 3 and 4.

With the foregoing in mind, the memory array 100 may maintain a currently stored memory state by providing a first voltage 510. Moreover, the memory array 100 may switch to an adjacent charge domain (e.g., another memory state) using a second voltage 515 that is between the first reference voltage 465 and the second reference voltage 470. Furthermore, the memory array 100 may switch to another charge domain (e.g., yet another memory state) using a third voltage 520. For example, the first voltage may be zero, the second voltage 515 may switch half of an overall charge dipole of the memory cell, and the third voltage may flip the charge dipole to an opposite charge dipole.

In some embodiments, the first voltage 510 and the third voltage 520 may correspond to voltage levels associated with flipping a value of a memory cell with two memory states. For example, in a memory cell with logic memory states 0 and 1, the respective memory array may maintain the current memory state by providing the first voltage 510 (e.g., 0 volts) or flip the memory state by providing the third voltage 520 (e.g., 1.5 volts). However, providing the second voltage 515 may achieve the intermediary memory state associated with the second voltage distribution 435 according to voltage ramp portion 525. That is, the memory array 100 may maintain a first memory state 305 of the memory cell of FIG. 3A by providing the first voltage 510 (e.g., zero volts), switch to the second memory state 310 by providing the second voltage 515, or switch to the third memory state 315 by providing the third voltage 520.

The memory array may program the memory cell according to the hysteresis curves 300 that are defined with respect to FIG. 3. The charge domains may refer to memory cell dipoles, such that the current memory state may be changed by switching all or half of the dipoles to switch one charge domain or flip the memory state to the other charge domain. In some embodiments, the first voltage 510, the second voltage 515, and the third voltage 520 may be predefined.

Figure 6:
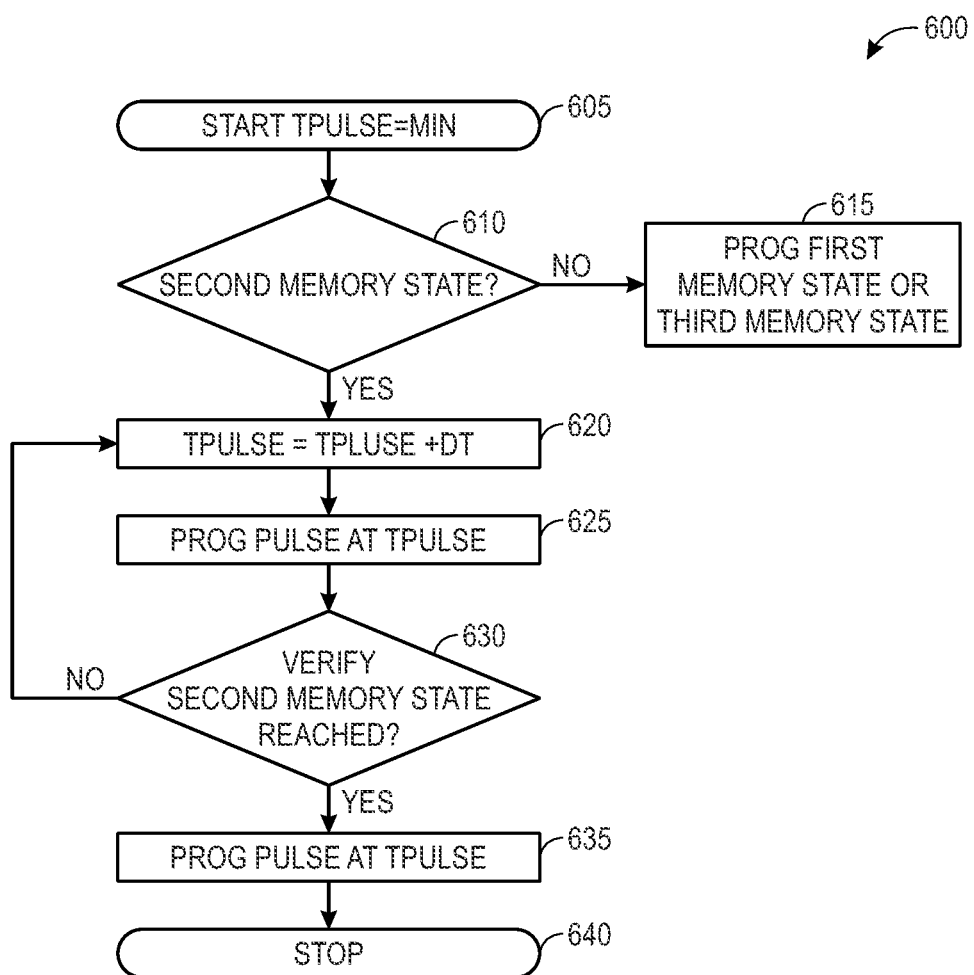
FIG. 6 is a method of implementing a specific charge amount associated with the first memory state, the second memory state, or the third memory state according to a pulse width timing method, as will be appreciated, in accordance with an embodiment of the present disclosure.
Figure 7:
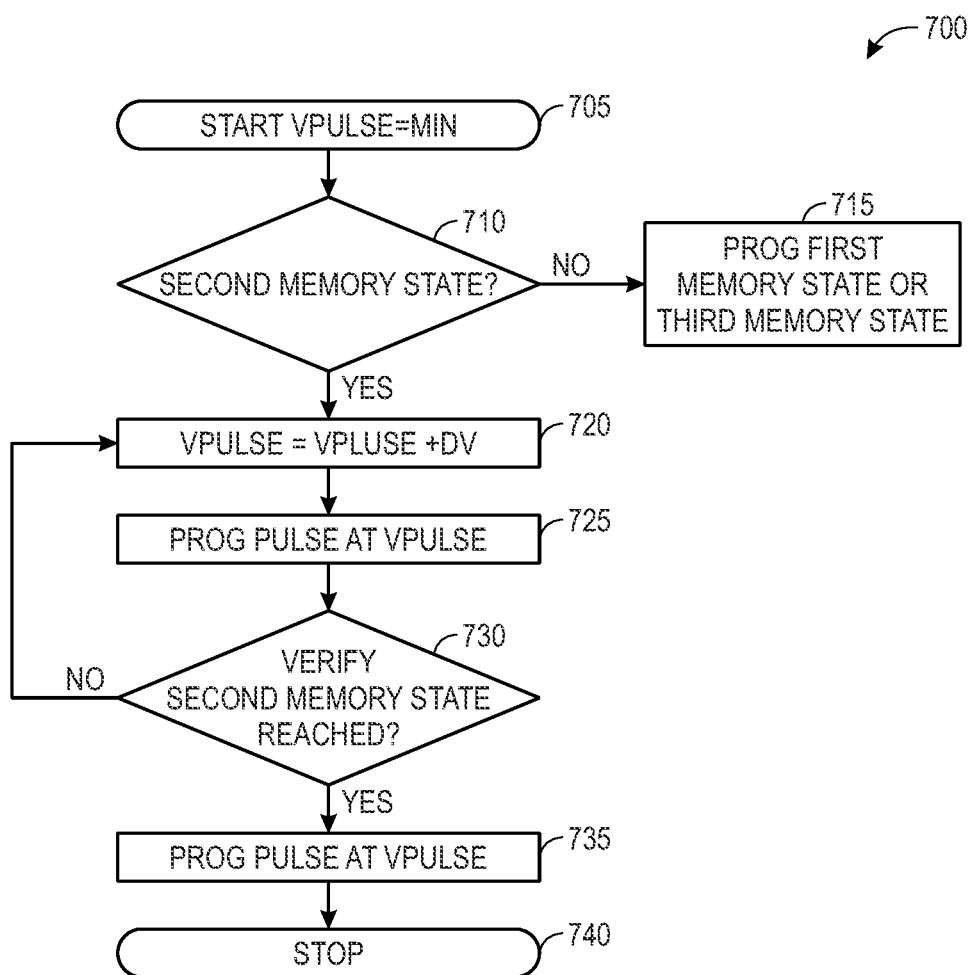
FIG. 7 is a method of implementing a specific charge amount associated with the first memory state, the second memory state, or the third memory state by adjusting a programming voltage of memory cell, in accordance with an embodiment of the present disclosure.

With the foregoing in mind. FIGS. 6 and 7 may provide two methods of programming the memory cell (e.g., the memory cell 105 and/or the ferroelectric memory cell 105-*a*) using three distinct memory states. Referring now to method 600 of FIG. 6, a method of implementing a specific charge amount associated with the first memory state 305, the second memory state 310, or the third memory state 315 may be described. The method 600 may be referred to as a pulse width timing method, wherein the applied voltage of the cell biasing signal is constant and the pulse width timing is adjusted or modulated, as will be appreciated.

The pulse width timing method 600 may adjust a pulse width timing for programming a memory cell with three memory states (e.g., memory states 305, 310, and 315). As such, the memory array 100 may program the memory cell by providing programming pulses. The memory array 100 may provide the programming pulses using a fixed voltage for changing the memory state and may adjust the timing of the programming pulse width, as will be appreciated.

At block 605, the memory array 100 may set a pulse timing to an initial value tpulse. The initial pulse time may be set to a minimum value. In specific embodiments, the minimum initial pulse time value is 40 nano seconds. At decision block 610, the pulse width timing method 600 may determine whether the first memory state 305, the second memory state 310, or the third memory state 315 is being programmed.

At decision block 610, the memory array 100 may determine that the first memory state 305 or the third memory state 315 is being programmed. As such, the memory array 100 may proceed to perform certain operations at block 615. At block 615, the memory array 100 may program the memory cell using a respective voltage level. For example, the memory array 100 may provide the first voltage 510 for programming the first memory state 305 or provide the third voltage 520 for programming the third memory state 315.

Alternatively, at decision block 610, the memory array 100 may determine that the second memory state 310 is being programmed. The memory array 100 may then proceed to block 620 to program the second memory state 310. Programming the second memory state 310 may be accomplished by providing a programming voltage (e.g., the second voltage 515) between a minimum (e.g., the first voltage 510) and a maximum (e.g., the third voltage 520) voltage associated with programming the memory cell. In some embodiments, because of narrow intermediary error distribution range (as described above with respect to FIG. 4) for programming the second memory state 310, additional measures may be used to verify successful programming of the second memory state 310. As such, at block 620, the memory array 100 may add a time (dt) to the initial tpulse programming time.

At block 625, the memory array 100 may program the memory cell by providing the programming voltage using the programming time tpulse. In some embodiments, the memory array 100 may program the memory cell using the sensing operations described above with respect to FIG. 3. The memory array 100 may then verify whether the memory cell has attained the second memory state 310 by providing the programming voltage another time and sensing the stored charge value at decision block 630. In some embodiments, the sensing may be performed according to operations discussed above with respect to FIG. 3. That said, in some embodiments, the sensing operations may be memory destructive and re-programming the memory state may be necessary after sensing the second memory state 310 is successfully programmed.

At decision block 630, the memory array 100 may determine that the second memory state 310 is not successfully programmed. For example, the memory array 100 may sense a charge level different from a predetermined charge level associated with the second memory state 310. On such occasion, the memory array 100 may re-try programming the memory cell with the second memory state 310 using a longer programming pulse. Accordingly, the memory array 100 may return to the block 620 to add an additional programming time (dt) to the tpulse programming time.

Subsequently, the memory array 100 may proceed to the block 625 to program the memory cell using the same programming voltage and the increased tpulse programming time. At decision block 630, the memory array 10 may then verify whether the memory cell has attained the second memory state 310 by providing the programming voltage again, and sensing the stored charge value. The memory array 100 may loop back to the block 620 if the memory cell has failed to attain the second memory state 310. The memory array 100 may repeat this process of adding additional programming time (dt) until the second memory state 310 is attained by the memory cell.

Alternatively, at the decision block 630, the memory cell 105 may verify that the second memory state 310 is stored on the memory cell. As such, the memory array 100 may proceed to block 635. At block 635, the memory array 100 may re-program the memory cell. The memory array 100 may re-program the memory cell using the tpulse programming time and programming voltage after sensing (and verifying) storage of the second memory state 310 on the memory cell. As such, the memory cell may attain the second memory state 310. The memory array 100 may then finish the pulse width timing method 600 at block 640.

Referring now to method 700 of FIG. 7, another method of implementing a specific charge amount associated with the first memory state 305, the second memory state 310, or the third memory state 315 may be described. The method 700 may be implemented by adjusting a programing voltage, wherein the applied programming voltage of the cell biasing signal is adjusted or modulated, while the pulse width timing is constant, as will be appreciated. The memory array 100 may program the memory cell by providing programming pulses. The memory array 100 may provide the programming pulses using a fixed pulse time for changing the memory state and may adjust the pulse voltage, as will be appreciated.

At block 705, the memory array 100 may set a pulse voltage to an initial pulse voltage value Vpulse. The initial pulse voltage may be set to a minimum value. In specific embodiments, the minimum pulse voltage value may be close or equal to the first reference voltage 465 as described above. At decision block 710, the method 700 may determine whether the first memory state 305, the second memory state 310, or the third memory state 315 is being programmed.

At decision block 710, the memory array 100 may determine that the first memory state 305 or the third memory state 315 is being programmed. As such, the memory array 100 may proceed to perform certain operations at block 715. At block 715, the memory array 100 may program the memory cell using a respective voltage level. For example, the memory array 100 may provide the first voltage 510 for programming the first memory state 305 or provide the third voltage 520 for programming the third memory state 315.

Alternatively, at decision block 710, the memory array 100 may determine that the second memory state 310 is being programmed. The memory array 100 may then proceed to block 720 to program the second memory state 310. Programming the second memory state 310 may be by the way of providing the programming voltage Vpulse for a predetermined time period. In some embodiments, because of narrow intermediary error distribution range (as described above with respect to FIG. 4) for programming the second memory state 310, additional measures may be used to verify successful programming of the second memory state 310. As such, at block 720, the memory array 100 may add a voltage (dV) to the initial Vpulse.

At block 725, the memory array 100 may program the memory cell by providing the programming voltage Vpluse using the predetermined programming time. In some embodiments, the memory array 100 may program the memory cell using the sensing operations described above with respect to FIG. 3. The memory array 100 may then verify whether the memory cell has attained the second memory state 310 by providing the Vpulse another time and sensing the stored charge value at decision block 730. In some embodiments, the sensing may be performed according to operations discussed above with respect to FIG. 3. That said, in some embodiments, the sensing operations may be memory destructive and re-programming the memory state may be necessary after sensing the second memory state 310 is successfully programmed.

At decision block 730, the memory array 100 may determine that the second memory state 310 is not successfully programmed. For example, the memory array 100 may sense a charge level different from a predetermined charge level associated with the second memory state 310. In such occasion, the memory array 100 may re-try programming the memory cell with the second memory state 310 using a higher programming voltage. Accordingly, the memory array 100 may return to the block 720 to add an additional programming voltage (dV) to the Vpulse.

Subsequently, the memory array 100 may proceed to the block 725 to program the memory cell using the increased Vpulse and the predetermined programming time. At decision block 730, the memory array 100 may then verify whether the memory cell has attained the second memory state 310 by providing the Vpulse again, and sensing the stored charge value. The memory array 100 may loop back to the block 720 if the memory cell has failed to attain the second memory state 310. The memory array 100 may repeat this process of adding additional programming voltage (dV) until the second memory state 310 is attained by the memory cell. However, the Vpulse may not exceed second reference voltage 470.

Alternatively, at the decision block 730, the memory cell 105 may verify that the second memory state 310 is stored on the memory cell. As such, the memory array 100 may proceed to block 735. At block 735, the memory array 100 may re-program the memory cell. The memory array 100 may re-program the memory cell using the Vpulse and the predetermined programming time after sensing (and verifying) storage of the second memory state 310 on the memory cell. As such, the memory cell may attain the second memory state 310. The memory array 100 may then finish the method 700 at block 740. It should be noted that in different embodiments, similar methods may be used for programming more than three memory states on a memory cell. Also, in different embodiments, other programming methods may be used for programming more than two memory states in a memory cell.

With these technical effects in mind, multiple memory devices may be included on a memory module, thereby enabling the memory devices to be communicatively coupled to the processing circuitry as a unit. For example, a dual in-line memory module (DIMM) may include a printed circuit board (PCB) and multiple memory devices. Memory modules respond to commands from a memory controller communicatively coupled to a client device or a host device via a communication network. For example, memory modules may store one of three or more memory states on one or more memory devices. Or in some cases, a memory controller may be used on the host-side of a memory-host interface; for example, a processor, microcontroller, field programmable gate array (FPGA), application-specific integrated circuit (ASIC), or the like may each include a memory controller.

This communication network may enable data communication there between and, thus, the client device to utilize hardware resources accessible through the memory controller. Based at least in part on user input to the client device, processing circuitry of the memory controller may perform one or more operations to facilitate the retrieval or transmission of data using multiple memory states between the client device and the memory devices. Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory, memory controller operations, and memory writing operations may manifest as improvements in visualization quality (e.g., speed of rendering, quality of rendering), improvements in processing operations, improvements in calculations, or the like.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
a memory array comprising a plurality of memory cells, wherein the memory array comprises circuitry to compensate for dielectric charges of the plurality of memory cells, wherein each memory cell of the plurality of memory cells is configured to store three memory states based on compensating for the dielectric charges of the plurality of memory cells;
a plurality of word lines, each word line of the plurality of word lines coupled to a row of memory cells of the plurality of memory cells;
a plurality of digit lines, each digit line of the plurality of digit lines coupled to a column of memory cells of the plurality of memory cells; and
a memory controller configured to access the plurality of memory cells via the plurality of word lines and the plurality of digit lines, wherein accessing a memory cell of the plurality of memory cells comprises applying a dielectric compensation voltage based on a voltage of a cell plate relative to a voltage of one or more other components and a polarization voltage to access between a first memory state, a second memory state, and a third memory state of the three memory states.

2. The memory device of claim 1, wherein accessing the memory cell comprises applying the dielectric compensation and the polarization voltage to read a stored memory state or write a memory state on the memory cell.

3. The memory device of claim 1, wherein the memory array comprises the circuitry to compensate for the dielectric charges of the plurality of memory cells using a plate pulse technique.

4. The memory device of claim 1, wherein the first memory state comprises a negative charge distribution, the second memory state comprises an intermediary charge distribution, and the third memory state comprises a positive charge distribution.

5. The memory device of claim 1, wherein the plurality of memory cells are ferroelectric memory cells, and wherein compensating for the dielectric charges of the plurality of memory cells comprises compensating for dielectric charges of ferroelectric capacitors of the Ferroelectric memory cells of the plurality of memory cells.

6. The memory device of claim 1, wherein compensating for the dielectric charges of the plurality of memory cells comprises reducing an amount of undesired intrinsic charges of each memory cell of the plurality of memory cells.

7. The memory device of claim 6, wherein each memory cell of the plurality of memory cells is configured to include three charge distribution windows in a net charge spread window to store the three memory states based on reducing the amount of undesired intrinsic charges of each memory cell of the plurality of memory cells.

8. The memory device of claim 1, wherein the memory controller is configured to access the memory cell of the plurality of memory cells based on using a pulse width timing method.

9. The memory device of claim 1, wherein the memory controller is configured to access the memory cell of the plurality of memory cells based on providing incremental programming voltage in a constant pulse width timing window.

10. A method, comprising:
applying, by a memory controller associated with a memory array, a dielectric compensation voltage to compensate for dielectric charges of a memory cell of a plurality of memory cells of the memory array; and
applying, by the memory controller, a polarization voltage to the memory cell of the plurality of memory cells, wherein accessing the memory cell comprises accessing between a first memory state, a second memory state, and a third memory state of the memory cell based on compensating for the dielectric charges of the memory cell of the plurality of memory cells.

11. The method of claim 10, wherein the first memory state comprises a first charge distribution window, the second memory state comprises a second charge distribution window, and the third memory state comprises a third charge distribution window.

12. The method of claim 11, wherein the first charge distribution window, the second charge distribution window, and the third charge distribution window are distinct based on compensating for the dielectric charges of the plurality of memory cells.

13. The method of claim 10, wherein accessing the memory cell comprises reading one of the first memory state, the second memory state, and the third memory state stored on the one or more target memory cells.

14. The method of claim 10, wherein accessing the one or more target memory cells comprises storing a charge amount associated with one of the first memory state, the second memory state, and the third memory state on the one or more target memory cells.

15. The method of claim 10, wherein accessing the one or more target memory cells of the plurality of memory cells comprises using a pulse width timing method or providing incremental programming voltage in a constant pulse width timing window.

16. An apparatus, comprising:
a memory array comprising a plurality of memory cells, wherein the memory array comprises circuitry to compensate for dielectric charges of the plurality of memory cells, wherein each memory cell of the plurality of memory cells is configured to store three memory states based on compensating for the dielectric charges of the plurality of memory cells; and
a memory controller configured to access the plurality of memory cells, wherein accessing a memory cell of the plurality of memory cells comprises applying a dielectric compensation voltage based on a voltage of a cell plate relative to a voltage of one or more other components and a polarization voltage to access between a first memory state, a second memory state, and a third memory state of the three memory states.

17. The apparatus of claim 16, wherein accessing the memory cell comprises applying a voltage to read a stored memory state or applying a voltage to write a memory state on the memory cell.

18. The apparatus of claim 16, wherein:
the first memory state comprises a first charge distribution window,
the second memory state comprises a second charge distribution window, and
the third memory state comprises a third charge distribution window;
wherein the first charge distribution window, the second charge distribution window, and the third charge distribution window are distinct based on compensating for the dielectric charges of the plurality of memory cells.

19. The apparatus of claim 16, wherein accessing the memory cell of the plurality of memory cells comprises using a pulse width timing method or providing incremental programming voltage in a constant pulse width timing window.

20. The apparatus of claim 16, wherein compensating for the dielectric charges of the plurality of memory cells comprises reducing an amount of undesired intrinsic charges of each memory cell of the plurality of memory cells.

* * * * *